(12) United States Patent
Malik

(10) Patent No.: US 7,679,458 B2
(45) Date of Patent: Mar. 16, 2010

(54) RING OSCILLATOR FOR DETERMINING SELECT-TO-OUTPUT DELAY OF A MULTIPLEXER

(75) Inventor: Khurram Zaka Malik, Santa Clara, CA (US)

(73) Assignee: QUALCOMM, Incorporated, San Diego, CA (US)

(*) Notice: Subject to any disclaimer, the term of this patent is extended or adjusted under 35 U.S.C. 154(b) by 236 days.

(21) Appl. No.: 11/296,073

(22) Filed: Dec. 6, 2005

(65) Prior Publication Data
US 2007/0126515 A1 Jun. 7, 2007

(51) Int. Cl.
*H03B 27/00* (2006.01)
(52) U.S. Cl. .................................. 331/57; 327/276
(58) Field of Classification Search .................. 331/57; 327/276
See application file for complete search history.

(56) References Cited

U.S. PATENT DOCUMENTS

| | | | |
|---|---|---|---|
| 5,596,302 A | 1/1997 | Mastrocola et al. | 331/57 |
| 6,069,849 A | 5/2000 | Kingsley et al. | 368/113 |
| 6,172,918 B1 * | 1/2001 | Hidaka | 365/189.11 |
| 6,253,352 B1 * | 6/2001 | Hanriat et al. | 716/4 |
| 6,850,123 B1 | 2/2005 | Verma et al. | 331/57 |
| 6,888,414 B2 | 5/2005 | Albean | 331/57 |
| 6,888,415 B2 | 5/2005 | Abidin et al. | 331/57 |

OTHER PUBLICATIONS

Data Sheet of National Semiconductor 54AC257.54ACT257 quad 2-input Multiplexer with Tri-State Outputs, Jul. 1998, p. 3.*

* cited by examiner

*Primary Examiner*—Joseph Chang
(74) *Attorney, Agent, or Firm*—Howard S. Seo; William M. Hooks

(57) ABSTRACT

The frequency of an oscillating signal generated by a ring oscillator is used to determine the select-to-output delay of standard cell multiplexers. The ring oscillator has no active logic elements other than an odd or even number of standard cell multiplexers. The signal path of the oscillating signal passes through the select input leads of the multiplexers of the ring oscillator. The ring oscillator can be used to characterize how signal propagation delay varies depending on the voltage supplied to the multiplexers. The lowest supply voltage at which a signal can continue to travel through the most critical circuit path of a test circuit can be modeled. In addition, the ring oscillator can be built into operational circuits to monitor timing and signal propagation delay in real time. Real time monitoring of delay enhances the benefits of adaptive voltage scaling, which is used in signal processing circuits in cell phones.

31 Claims, 7 Drawing Sheets

RING OSCILLATOR FOR DETERMINING SELECT-TO-OUTPUT DELAY OF A MULTIPLEXER

BACKGROUND

1. Field

The present disclosure relates generally to oscillator devices and, more specifically, to an oscillator circuit for measuring signal propagation delay through integrated circuits.

2. Background

A ring oscillator is typically considered to be a device composed of an odd number of inverters whose output oscillates between two voltage levels. The inverters are connected in a ring, and the output of the last inverter is fed back to the input of the first inverter. Each inverter outputs an inverted voltage level a finite amount of time after the input voltage level of that inverter has changed. Thus, each inverter acts as a delay element. The feedback of an inverted voltage to the input of the first inverter causes the voltage levels in the ring to oscillate. The frequency of oscillation depends on the delay of each inverter and the number of inverters in the ring. In a typical implementation of a delay element, the delay decreases as the voltage that powers the delay element increases. Therefore, one common application of a ring oscillator is in a voltage-controlled oscillator (VCO).

FIG. 1 (prior art) shows a conventional ring oscillator 10 formed from five inverters. Conventional wisdom has held that a ring composed of an even number of ring elements cannot oscillate because the output voltage level of the last ring element would be the same as the original input voltage level of the first ring element. Ring oscillators with an even number of ring elements, however, have been developed. For example, FIG. 2 (prior art) shows a ring oscillator 11 formed from an even number of ring elements that is connected in a differential arrangement. Each inverter in the ring is driven by differential signals.

Another application of ring oscillators is to test signal propagation delay in integrated circuits. Faster switching integrated circuits provide benefits, especially in the fields of communications and data processing. In order fully to benefit from the faster switching speeds, however, the limits of the performance of the integrated circuit must be determined. Ring oscillators can be used to test the speed performance of a circuit design.

FIG. 3 (prior art) shows a ring oscillator 12 formed from an even number of ring elements that is used to test speed performance of an integrated circuit. The frequency of ring oscillator 12 is used to measure how long a test signal takes to propagate through the test integrated circuit. The propagation delay measured by ring oscillator 12 is the sum of delays through various components, including two flip-flops, two delay elements and an AND gate. The frequency of the oscillation of the ring oscillator 12 alone does not indicate the clock-to-out delay of one of the flip-flops, the delay of a delay element, or the delay of the AND gate. Other methods must be used to determine these individual delays.

A method is sought for using a ring oscillator to determine the signal propagation delay through a distinct component type, such as a multiplexer. Moreover, it can be difficult to measure propagation delay along a signal path that passes through the select input of a multiplexer. Thus, a method is sought for determining the select-to-output delay of a multiplexer.

SUMMARY

A ring oscillator includes two or more multiplexer elements with substantially identical structures. Each multiplexer element has two data input leads, a select input lead and an output lead. The ring oscillator has no active logic elements other than the multiplexer elements. There can be an odd or an even number multiplexer elements.

For embodiments of the ring oscillator that include an even number of multiplexer elements, the logic levels maintained on the two data input leads of the first and last multiplexer elements have the opposite orientation. On the first multiplexer element, a first logic level is maintained on the first data input lead and a second logic level is maintained on the second data input lead. On the last multiplexer element, the second logic level is maintained on the first data input lead and the first logic level is maintained on the second data input lead. Moreover, for embodiments with an even number of four or more multiplexer elements, the orientation of the logic levels on the data input leads of adjacent multiplexer elements alternates such that where a first logic level is maintained on the first data input lead of a multiplexer element, the second logic level is maintained of the first data input lead of the adjacent multiplexer element.

For embodiments of the ring oscillator that include an odd number of multiplexer elements, the logic levels maintained on the data input leads of all of the multiplexer elements have the same orientation. On each multiplexer element, one of the data input leads is maintained at the first logic level, and the other data input lead is maintained at the second logic level.

For embodiments with both an odd or an even number multiplexer elements, the ring oscillator generates an oscillating signal whose signal path passes through the select input lead of each multiplexer element.

The multiplexer elements of the ring oscillator are part of a system for determining the signal propagation delay from the output lead of the last multiplexer element, through the select input lead of the first multiplexer element, through the select input leads of all of the other multiplexer elements, and back to the output lead of the last multiplexer element. The frequency of the oscillating signal is a function of the signal propagation delay through the multiplexer elements, and the frequency of the oscillating signal is used to determine the select-to-output delay of a multiplexer element. Signal propagation delay through a multiplexer element typically increases as the supply voltage powering the multiplexer decreases. The ring oscillator can, therefore, be used to characterize how signal propagation delay varies depending on the voltage supplied to the multiplexers. The lowest supply voltage at which a signal can continue to travel through the most critical circuit path of a test circuit containing multiplexer elements can be modeled. In addition, the ring oscillator can be built into operational circuits to monitor timing and signal propagation delay in real time.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
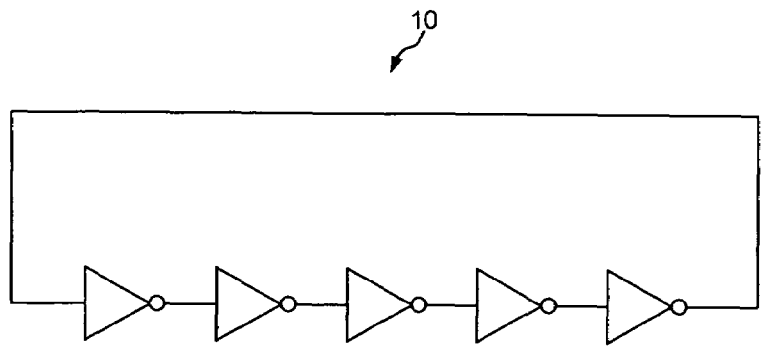
FIG. 1 (prior art) is a schematic circuit diagram of a ring oscillator formed from five inverters.
Figure 2:
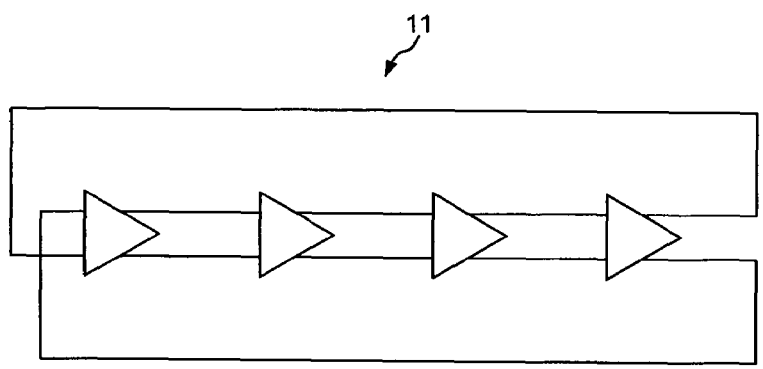
FIG. 2 (prior art) is a schematic circuit diagram of a ring oscillator formed from an even number of ring elements and connected in a differential setup.
Figure 3:
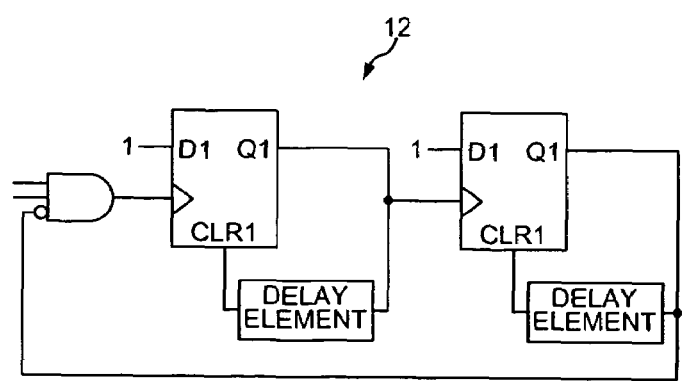
FIG. 3 (prior art) is a simplified block diagram of a ring oscillator formed from an even number of ring elements that is used to test speed performance of an integrated circuit.
Figure 4:
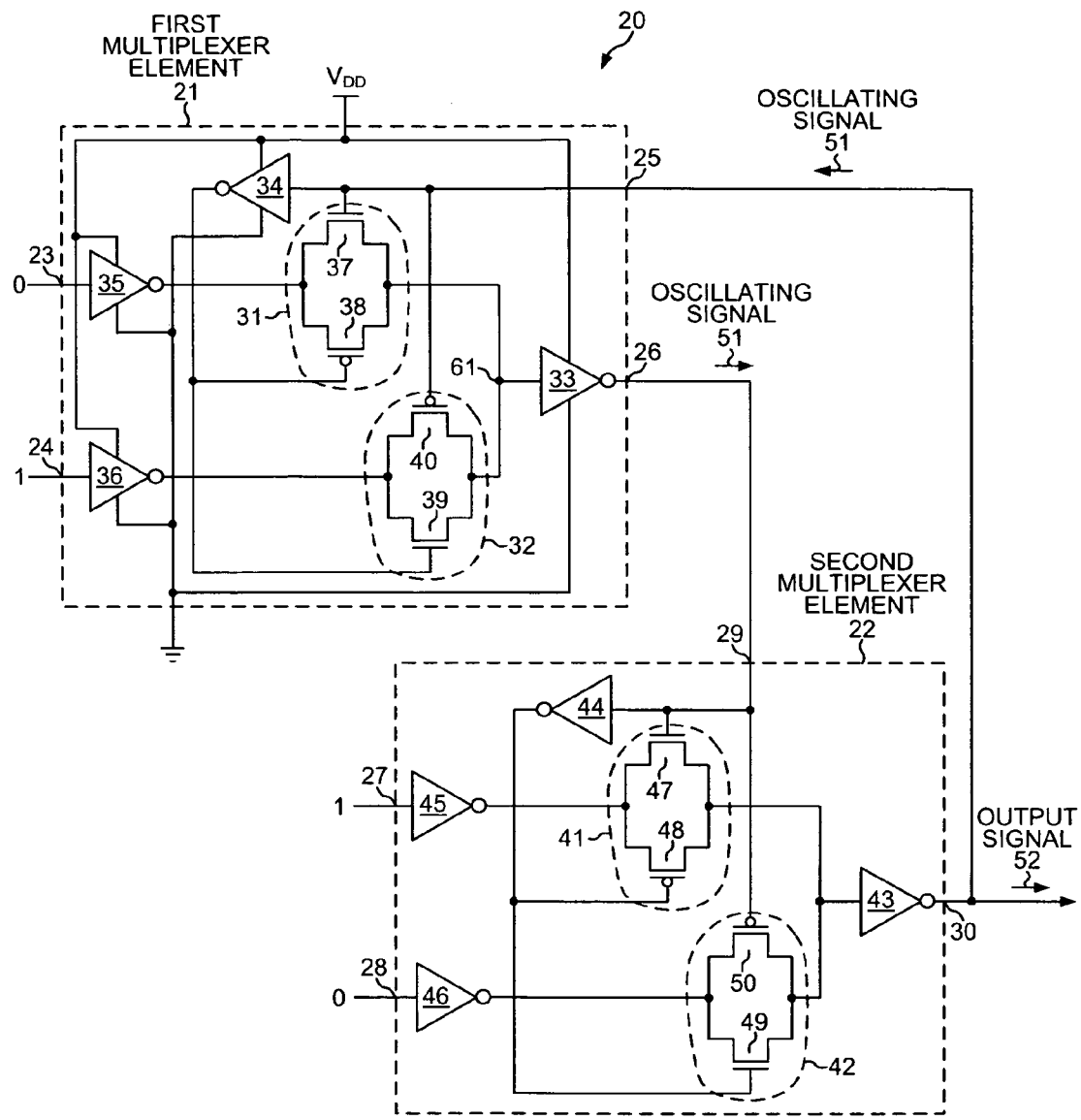
FIG. 4 is a simplified block diagram of a ring oscillator with an even number of ring elements in accordance with one embodiment.

In accordance with one embodiment, FIG. 4 depicts one implementation of a ring oscillator 20 that includes an even number of ring elements. Ring oscillator 20 has a first multiplexer element 21 and a second multiplexer element 22. The structure of each of first multiplexer element 21 and second multiplexer element 22 is substantially identical. First multiplexer element 21 has a first data input lead 23, a second data input lead 24, a select input lead 25 and an output lead 26. Likewise, second multiplexer element 22 has a first data input lead 27, a second data input lead 28, a select input lead 29 and an output lead 30. Output lead 30 of second multiplexer element 22 is coupled to select input lead 25 of first multiplexer element 21. In this embodiment with two ring elements, output lead 26 of first multiplexer element 21 is coupled directly to select input lead 29 of second multiplexer element 22. In other embodiments described below, output lead 26 of first multiplexer element 21 is coupled to select input lead 29 of second multiplexer element 22 through any number of multiplexer elements that are substantially identical to first and second multiplexer elements 21 and 22.

In this embodiment, first multiplexer element 21 includes two pass gates 31 and 32 and four inverters 33-36. Pass gate 31 is formed with an n-channel field-effect transistor (FET) 37 and a p-channel FET 38. Pass gate 32 is formed with an n-channel field-effect transistor (FET) 39 and a p-channel FET 40. Likewise, second multiplexer element 22 includes two pass gates 41 and 42 and four inverters 43-46. Pass gate 41 is formed with an n-channel field-effect transistor (FET) 47 and a p-channel FET 48. Pass gate 42 is formed with an n-channel field-effect transistor (FET) 49 and a p-channel FET 50.

A first logic level is maintained on first data input lead 23 of first multiplexer element 21. A second logic level is maintained second data input lead 24 of first multiplexer element 21. In this embodiment, the first logic level is ground potential, and the second logic level is one volt. In other embodiments, other voltage levels are used for the first and second logic levels. For example, 3.3 volts can be used for the first logic level, and ground potential can be used for the second logic level. In addition to the logic levels constantly present on the data input leads of first multiplexer element 21, the second logic level is maintained on first data input lead 27 of second multiplexer element 22, and first logic level is maintained on second data input lead 28 of second multiplexer element 22.

When the aforementioned logic levels are maintained on the data input leads of first multiplexer element 21 and the data input leads of second multiplexer element 22, ring oscillator 20 begins spontaneously to oscillate. A free-running oscillating signal 51 propagates along a signal path around ring oscillator 20. The signal path passes through output lead 30 of second multiplexer element 22, select input lead 25 of first multiplexer element 21, output lead 26 of first multiplexer element 21, select input lead 29 of second multiplexer element 22 and back to output lead 30 of second multiplexer element 22. An output signal 52 can be tapped from a node coupled to output lead 30 of second multiplexer element 22.

Figure 5:
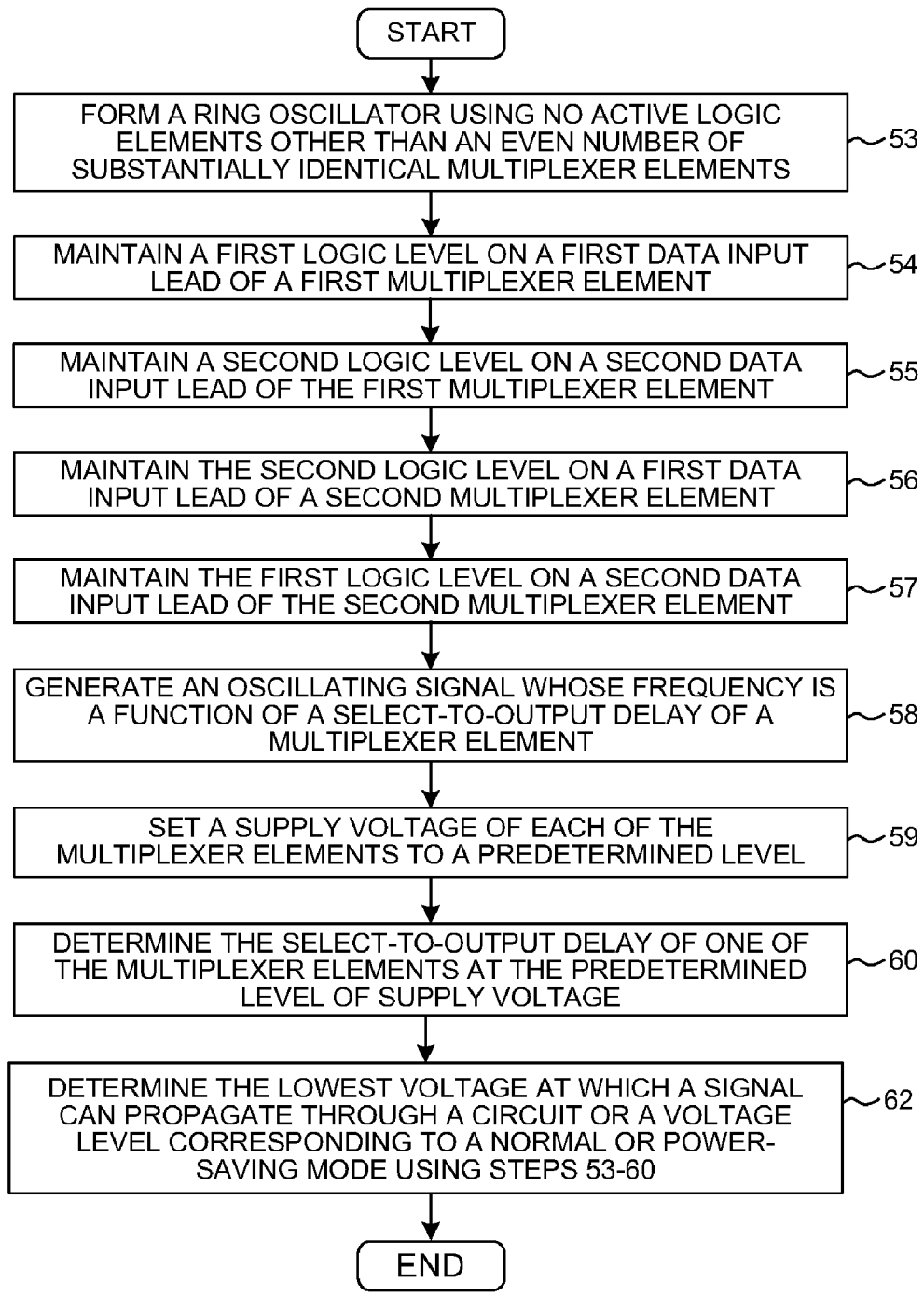
FIG. 5 is a flowchart of steps for determining the signal propagation delay through a test circuit using the ring oscillator of FIG. 4.

FIG. 5 is a flowchart showing steps 53-60 by which ring oscillator 20 with an even number of ring elements is used to determine the signal propagation delay through a test circuit. In this embodiment, the test circuit consists entirely of standard cell multiplexers, and ring oscillator 20 is used to measure the select-to-output delay of a standard cell multiplexer. A first component of the select-to-out delay is the delay after a change in the voltage level on a gate of a pass gate until current begins to flow through the diffusion layer of a FET of the pass gate. A second component of the select-to-output delay is the speed at which current flows from the source, through the diffusion layer and to the drain of a FET of a pass gate. The first component is dependent on the gate capacitances of the FETs, whereas the second component is dependent on the capacitances of the diffusion layers of the FETs. In addition to determining the select-to-output delay of a standard cell multiplexer, the delay is characterized over process, voltage and temperature variations. In other embodiments, ring oscillator 20 with an odd number of ring elements is used to determine signal propagation delay.

In a first step 53, a ring oscillator is formed using no active logic elements other than an even number of substantially identical multiplexer elements. In this example, steps 53-60 for determining the signal propagation delay are explained in connection with a ring oscillator with two ring elements, as shown in FIG. 4.

In a step 54, the first logic level is maintained on first data input lead 23 of first multiplexer element 21. In a step 55, the second logic level is maintained at second data input lead 24 of first multiplexer element 21. In a step 56, the second logic level is maintained on first data input lead 27 of second multiplexer element 22. In a step 57, the first logic level is maintained on second data input lead 28 of second multiplexer element 22.

In a step 58, free-running oscillation around ring oscillator 20 generates oscillating signal 51, whose frequency is a function of the select-to-output delay of one of the substantially identical multiplexer elements. The frequency of oscillating signal 51 is approximately equal to the reciprocal of one half of the combined select-to-output delays of first multiplexer element 21 and second multiplexer element 22. Thus, ring oscillator 20 forms a test circuit that can be used to measure the signal propagation delay through a standard cell multiplexer. The path of ring oscillator 20 is the path of the test circuit. The select-to-output delay of a standard cell multiplexer is expressed by the equation delay=1/ ($\frac{1}{2} \cdot N \cdot$ frequency), where N is the number of ring elements, in this case 2.

With reference to first multiplexer element 21, the select-to-output delay can be expressed in a first situation as the delay after a low voltage level on select input lead 25 changes to a high voltage level until a high voltage level on output lead 26 changes to a low voltage level. In this first situation, the delay is dependent on the time it takes for a low voltage level on a node 61 to charge up from a low voltage level to a high voltage level. In a second situation, the select-to-output delay can be expressed as the delay after a high voltage level on select input lead 25 changes to a low voltage level until a low voltage level on output lead 26 changes to a high voltage level. In this second situation, the delay is dependent on the time it takes for a high voltage level on node 61 to discharge from a high voltage level to a low voltage level. The select-to-output delay in the first situation is typically longer than the select-to-output delay in the second situation, and the signal propagation delay determined according to the method of steps 53-60 is the average of the delays in both situations.

In a step 59, the supply voltage that powers each of the standard cell multiplexers is set to a predetermined level. In this example, the supply voltage $V_{DD}$ that powers the standard cell multiplexers, including first multiplexer element 21, is set to one volt, for example. In a typical implementation of a ring element, such as a standard cell multiplexer, the delay through the ring element decreases as the voltage that powers the delay element increases.

In a step 60, the select-to-output delay of one of the standard cell multiplexers is determined at the predetermined level of the supply voltage set in step 59. The delay is determined by first determining the frequency of output signal 52. In one example, the frequency of output signal 52 is one Gigahertz at a supply voltage of one volt. Thus, the select-to-output delay of a standard cell multiplexer in this example is one nanosecond.

Where the frequency of output signal 52 slows to 900 Megahertz when the supply voltage is reduced to 0.7 volts, the select-to-output delay of the standard cell multiplexer becomes 1.11 nanosecond. The select-to-output delay is thereby determined at various supply voltage levels. These frequencies and delays are given as examples only. The actual select-to-output delay of a state-of-the-art standard cell multiplexer may be much shorter, for example, around fifty picoseconds.

Manufacturers of integrated circuits publish lists of delay values for various types of delay elements in their integrated circuits, including standard cell multiplexers. The delay values are used to model circuit timing for prospective circuit designs. Some circuits are designed for power-critical applications. In applications that employ adaptive voltage scaling, the circuits are powered by one voltage level in a normal operational mode and by a lower voltage level in a power-saving mode. Adaptive voltage scaling is used, for example, in signal processing circuits in cell phones. The method of steps 53-60 can be used to determine 62 the supply voltage at which the delay through the most critical circuit path renders a circuit that includes standard cell multiplexers non-functional. The lowest acceptable supply voltage can thereby be modeled for a prospective circuit with standard cell multiplexers the employs adaptive voltage scaling. The delay values for a standard cell multiplexers at different supply voltages are typically determined by keeping temperature and process conditions constant. Delay values for standard cell multiplexers at various temperatures may also be determined by keeping supply voltage and process conditions constant. Finally, the dependence of delay values on process variations may also be determined by keeping supply voltage and temperature constant.

In addition to determining select-to-output delay values for modeling prospective circuits, ring oscillator 20 may also be used to test timing and signal propagation delay in circuits already built. In another embodiment, ring oscillator 20 is included as a small test circuit in an operational circuit that employs standard cell multiplexers. The frequency of output signal 52 is used to determine the select-to-output delay of the standard cell multiplexers in actual operation at the actual supply voltage and temperature and for the particular process variations that affect the operational circuit. Thus, ring oscillator 20 is used to monitor timing and signal propagation delay in real time. Real time monitoring of signal propagation delay can enhance the benefits of adaptive voltage scaling. Where the embodiment of ring oscillator 20 with two ring elements generates output signal 52 with a very high frequency, more ring elements may be added to ring oscillator 20 to generate a lower frequency output signal 52. Where the frequency of ring oscillator 20 is very high, cumbersome and costly frequency division may be required by the operational circuit to permit calculation of the select-to-output delay value.

Figure 6:
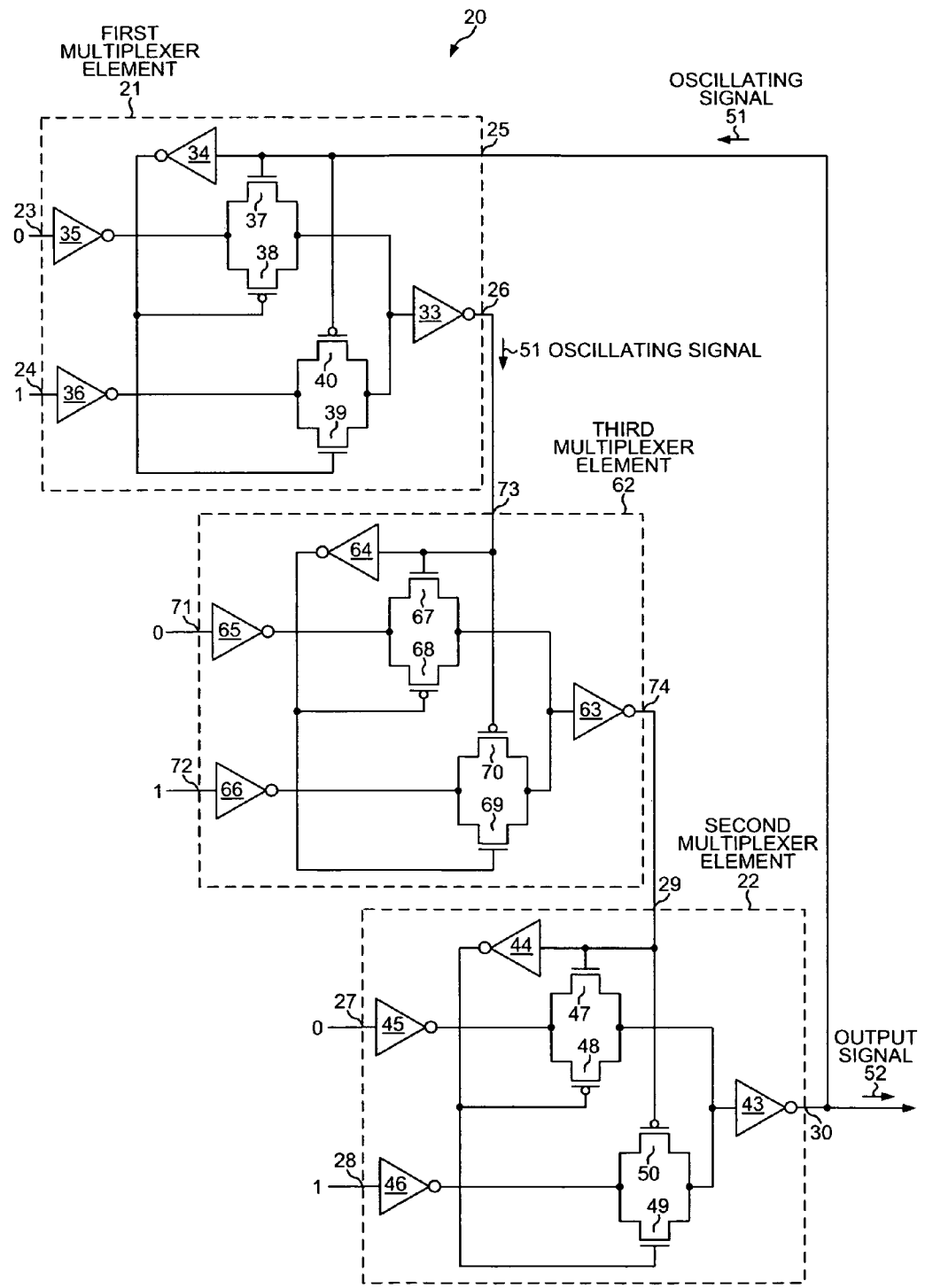
FIG. 6 is a simplified block diagram of a ring oscillator with an odd number of ring elements in accordance with another embodiment.
Figure 7:
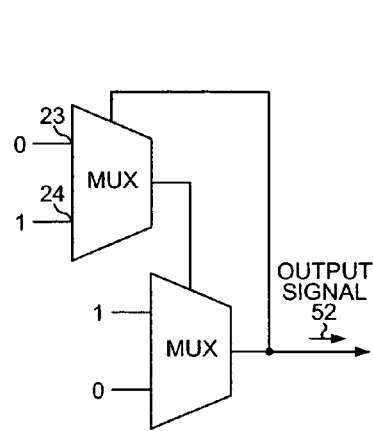
FIGS. 7-10 are simplified block diagrams of ring oscillators with two, three, four and five multiplexer elements, respectively, in accordance with yet other embodiments.

FIG. 6 shows an embodiment of ring oscillator 20 with an odd number of ring elements that is also used to determine the signal propagation delay standard cell multiplexers. In addition to first multiplexer element 21 and second multiplexer element 22, this embodiment of ring oscillator 20 has a third multiplexer element 62. Third multiplexer element 62 includes four inverters 63-66, four FETs 67-70, a first data input lead 71, a second data input lead 72, a select input lead 73 and an output lead 74. Output lead 26 of first multiplexer element 21 is coupled to select input lead 73 of third multiplexer element 62. Output lead 74 of third multiplexer element 62 is coupled to select input lead 29 of second multiplexer element 22.

As in the embodiment of FIG. 4, the first logic level is maintained on first data input lead 23 of first multiplexer element 21, and the second logic level is maintained on the second data input lead 24 of first multiplexer element 21. Unlike the embodiment of FIG. 4, however, logic levels are maintained on the data input leads of second multiplexer element 22 in an orientation analogous to that of first multiplexer element 21. In fact, for all embodiments of ring oscillator 20 that have an odd number of multiplexer elements, the first logic level is maintained on all first data input leads, and the second logic level is maintained on all second data input leads. For the embodiment of ring oscillator 20 in FIG. 6, the select-to-output delay of one of the multiplexer elements is the reciprocal of three halves of the frequency of output signal 52.

FIGS. 7-10 show the configurations of embodiments of ring oscillator 20 with two, three, four and five multiplexer elements, respectively. The ring oscillators shown in FIGS. 7 and 9 demonstrate that the logic levels maintained on the data input leads of the first and second multiplexer elements have the opposite orientation in embodiments of ring oscillator 20 that have an even number of multiplexer elements. Where the first logic level is maintained on first data input lead 23 of first multiplexer element 21, the second logic level is maintained of first data input lead 27 of second multiplexer element 22. Moreover, the orientation of the logic levels on the data input leads of adjacent multiplexer elements alternates such that where a first logic level is maintained on the first data input lead of a multiplexer element, the second logic level is maintained of the first data input lead of the adjacent multiplexer element.

Figure 8:
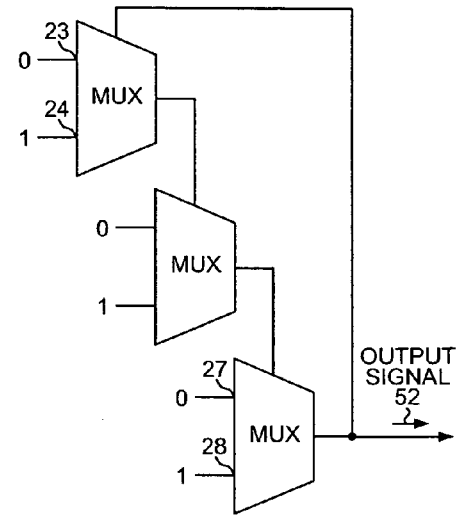
Figure 9:
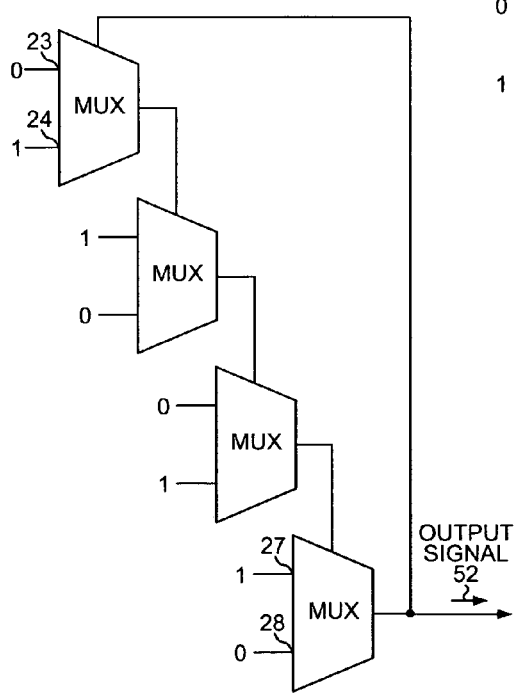
Figure 10:
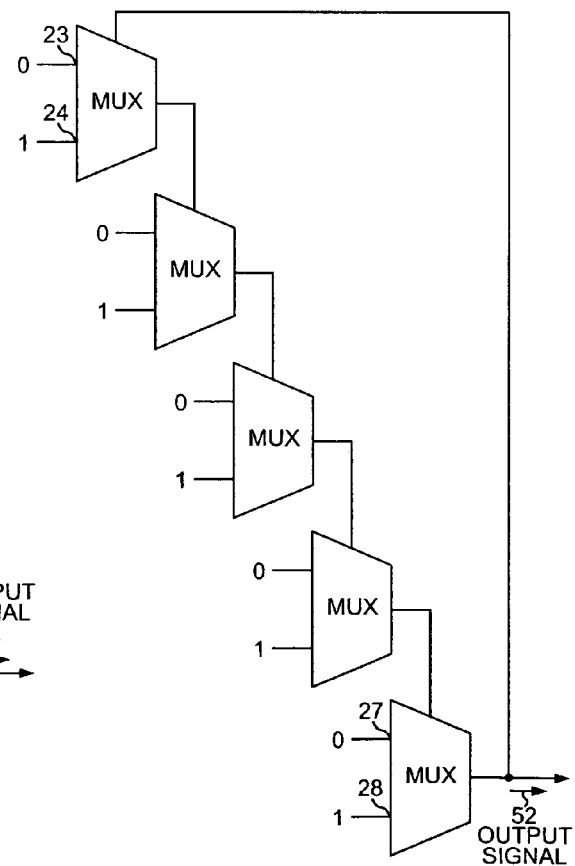

The ring oscillators shown in FIGS. 8 and 10 demonstrate that the logic levels maintained on the data input leads have the same orientation for all of the multiplexer elements in embodiments of ring oscillator 20 that have an odd number of multiplexer elements. On each multiplexer element, one of the data input leads is maintained at the first logic level, and the other data input lead is maintained at the second logic level.

Figure 11:
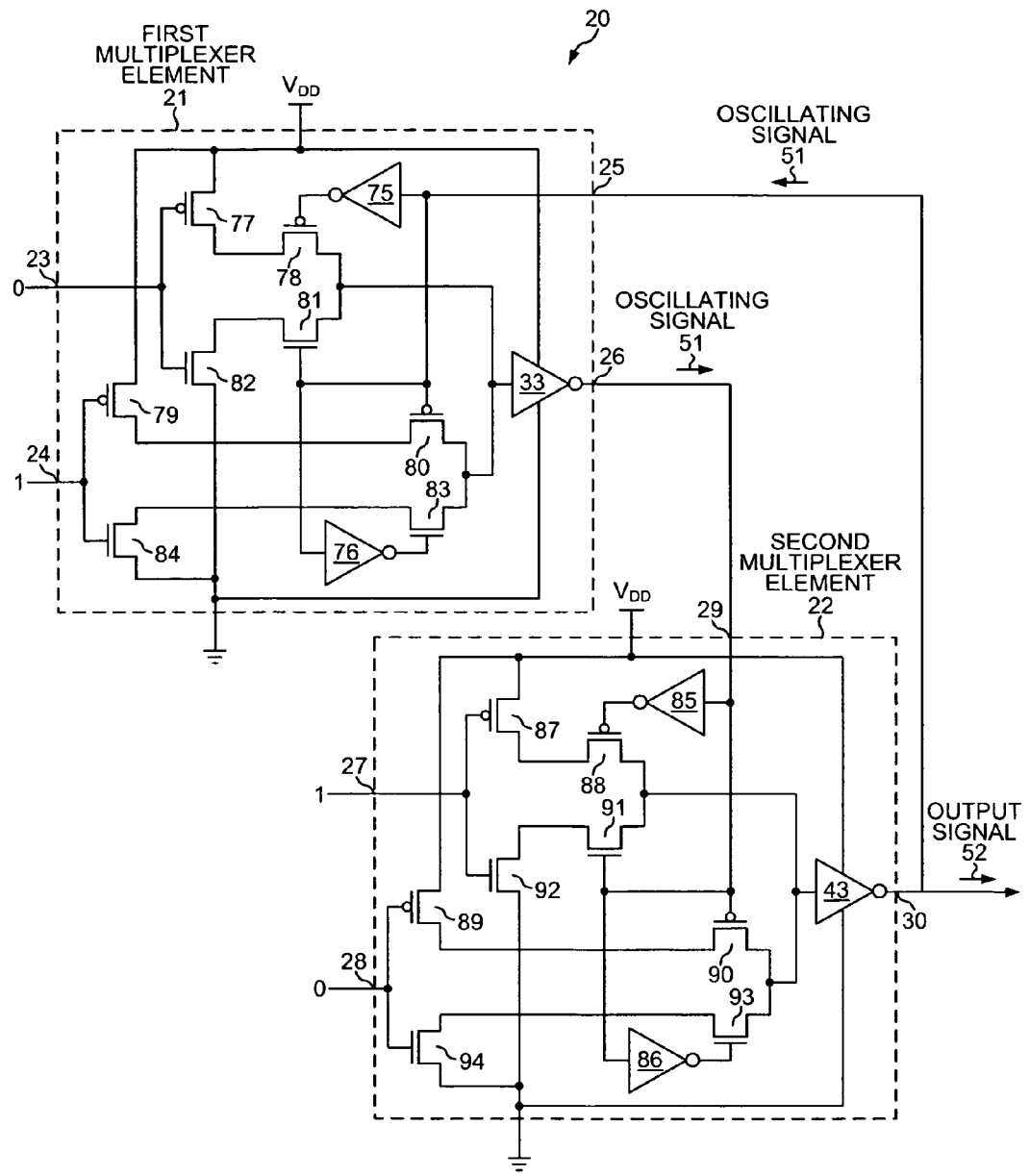
FIG. 11 is a simplified block diagram of a ring oscillator in which pass gates of the embodiment of FIG. 4 are replaced with tristate multiplexers.

FIG. 11 shows an embodiment of ring oscillator 20 in which first multiplexer element 21 and second multiplexer element 22 are configured as tristate multiplexers. In addition to inverter 33, this embodiment of first multiplexer element 21 includes two inverters 75-76, four p-channel FETs 77-80 and four n-channel FETs 81-84. In addition to inverter 43, this embodiment of second multiplexer element 22 includes two inverters 85-86, four p-channel FETs 87-90 and four n-channel FETs 91-94.

Figure 12:
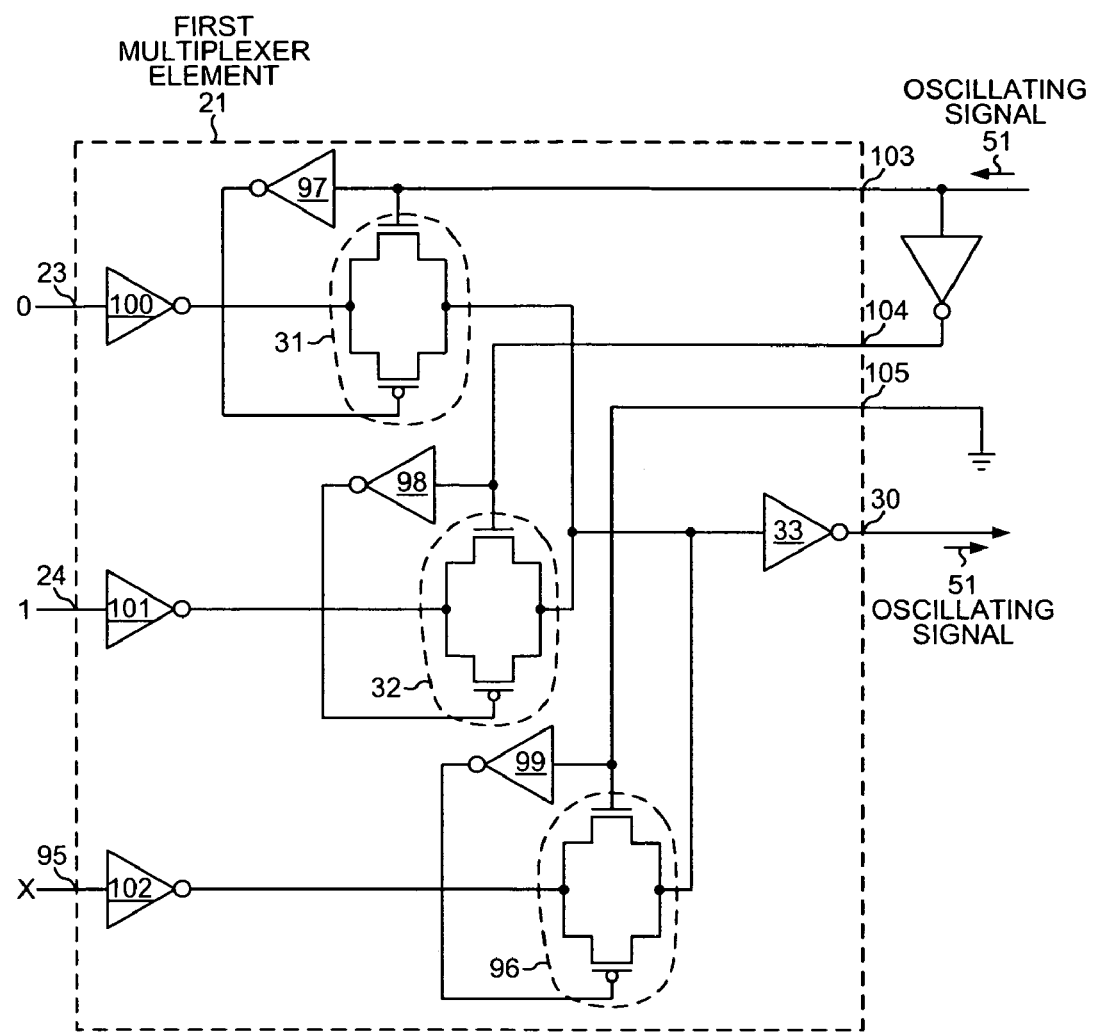
FIG. 12 is a simplified block diagram of a multiplexer element of an embodiment of a ring oscillator in which the multiplexer element is a 3:1 multiplexer.

Although the present invention has been described in connection with certain specific embodiments for instructional purposes, the present invention is not limited thereto. For example, although ring oscillator 20 is described above as including multiplexer elements that are 2:1 multiplexers, other embodiments of ring oscillator 20 are formed from higher order multiplexers. FIG. 12 shows an embodiment in which first multiplexer element 21 is a 3:1 multiplexer. In addition to first data input lead 23 and second data input lead 24, the embodiment shown in FIG. 12 includes a third data input lead 95. The logic level maintained on third data input lead 95 does not affect oscillating signal 51. In addition to pass gates 31 and 32, the embodiment shown in FIG. 12 includes a third pass gate 96. In addition to inverter 33, this embodiment includes six inverters 97-102. The 3:1 multiplexer of FIG. 12 is adapted to receive three select bits on select input leads 103-105. Where ring oscillator 20 is formed from 3:1 multiplexers, second select input lead 104 is configured to receive the inverse of the signal received on first select input lead 103, and third select input lead 105 is coupled to ground. Thus, the signal path of oscillating signal 51 travels through the first and second select input leads of each 3:1 multiplexer, and the frequency of oscillating signal 51 can be used to determine the select-to-output delay of a standard cell 3:1 multiplexer.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Accordingly, the present invention is not intended to be limited to the embodiments shown herein but is to be accorded the widest scope consistent with the principles and novel features disclosed herein.

What is claimed is:

1. A circuit comprising:
   a first multiplexer with an output lead, a select input lead, a first data input lead and a second data input lead; and
   a second multiplexer with an output lead and a select input lead, wherein the first multiplexer and the second multiplexer have substantially identical structures, wherein the output lead of the second multiplexer is coupled to the select input lead of the first multiplexer, wherein an oscillating signal is present on the output lead of the second multiplexer, wherein the output lead of the first multiplexer is coupled to the select input lead of the second multiplexer, wherein a first logic level is constantly present on the first data input lead of the first multiplexer and a second logic level is constantly present on the second data input lead of the first multiplexer, and wherein the first and second multiplexers are powered by a supply voltage that can be set to a predetermined level to vary the supply voltage.

2. The circuit of claim 1, wherein the second multiplexer has a first data input lead and a second data input lead, wherein the output lead of the first multiplexer is coupled to the select input lead of the second multiplexer through an even number of multiplexers, wherein each of the even number of multiplexers and the first multiplexer have substantially identical structures, and wherein the second logic level is constantly present on the first data input lead of the second multiplexer and the first logic level is constantly present on the second data input lead of the second multiplexer.

3. The circuit of claim 2, wherein each of the even number of multiplexers has a select input lead, and wherein the oscillating signal is present on the select input lead of each of the even number of multiplexers.

4. The circuit of claim 1, wherein the second multiplexer has a first data input lead and a second data input lead, wherein the output lead of the first multiplexer is coupled to the select input lead of the second multiplexer through an odd number of multiplexers, wherein each of the odd number of multiplexers and the first multiplexer have substantially identical structures, and wherein the first logic level is constantly present on the first data input lead of the second multiplexer and the second logic level is constantly present on the second data input lead of the second multiplexer.

5. The circuit of claim 4, wherein each of the odd number of multiplexers has a select input lead, and wherein the oscillating signal is present on the select input lead of each of the odd number of multiplexers.

6. The circuit of claim 1, wherein the oscillating signal is a free-running oscillating signal.

7. The circuit of claim 1, wherein the first multiplexer comprises an inverter connected to the output lead of the first multiplexer.

8. The circuit of claim 1, wherein the first multiplexer comprises two pass gates.

9. The circuit of claim 1, wherein the first multiplexer is a tristate multiplexer.

10. The circuit of claim 1, wherein the oscillating signal propagates along a signal path around a ring oscillator, and wherein the signal path passes through the select input lead of the first multiplexer and through the select input lead of the second multiplexer.

11. The circuit of claim 1, wherein the first multiplexer and the second multiplexer are part of a ring oscillator.

12. The circuit of claim 1, wherein the first multiplexer and the second multiplexer are part of a system for determining a signal propagation delay from the output lead of the second multiplexer, through the select input lead of the first multiplexer, through the select input lead of the second multiplexer and back to the output lead of the second multiplexer.

13. A method comprising:
   forming a ring oscillator from substantially identical multiplexer elements, wherein the ring oscillator includes no active logic elements other than the substantially identical multiplexer elements, and wherein each of the substantially identical multiplexer elements is powered by a supply voltage; and
   setting the supply voltage of each of the substantially identical multiplexer elements to a predetermined level.

14. The method of claim 13, further comprising:
determining a select-to-output delay of one of the substantially identical multiplexer elements by determining a frequency of an oscillating signal present on the ring oscillator.

15. The circuit of claim 14, wherein the oscillating signal is a free-running oscillating signal.

16. The method of claim 13, further comprising:
determining a select-to-output delay of one of the substantially identical multiplexer elements at the predetermined level of supply voltage.

17. The method of claim 13, wherein the ring oscillator has an even number of substantially identical multiplexer elements, wherein the ring oscillator includes a first multiplexer element with a select input lead, a first data input lead and a second data input lead, wherein the ring oscillator includes a second multiplexer element with an output lead, a first data input lead and a second data input lead, and wherein the output lead of the second multiplexer element is connected to the select input lead of the first multiplexer element, further comprising:
maintaining a first logic level on the first data input lead of the first multiplexer element;
maintaining a second logic level on the second data input lead of the first multiplexer element;
maintaining the second logic level on the first data input lead of the second multiplexer element; and
maintaining the first logic level on the second data input lead of the second multiplexer element.

18. The method of claim 13, further comprising:
determining a lowest supply voltage at which a signal can propagate through a circuit containing the substantially identical multiplexer elements.

19. The method of claim 13, further comprising:
determining at least one of:
a voltage level that corresponds to a normal operational mode for a circuit containing the substantially identical multiplexer elements, and
a voltage level that corresponds to a power-saving mode for a circuit containing the substantially identical multiplexer elements.

20. A method comprising:
generating an oscillating signal whose frequency is a function of a propagation delay of the oscillating signal through a select input lead of a standard cell multiplexer, wherein the oscillating signal has a signal path that passes through no active logic elements other than standard cell multiplexers; and
setting a supply voltage of the standard cell multiplexer to a predetermined level.

21. The method of claim 20, further comprising:
determining a select-to-output delay of the standard cell multiplexer using the frequency of the oscillating signal, wherein the select-to-output delay of the standard cell multiplexer includes the propagation delay of the oscillating signal through the select input lead of the standard cell multiplexer.

22. The method of claim 21, wherein the signal path passes through a number of standard cell multiplexers, wherein the frequency of the oscillating signal equals approximately the reciprocal of one half of a combined delay, and wherein the combined delay equals the select-to-output delay of the standard cell multiplexer times the number of standard cell multiplexers in the signal path.

23. The method of claim 20, wherein the signal path passes through an even number of standard cell multiplexers.

24. The method of claim 20, wherein the standard cell multiplexer comprises two pass gates.

25. The method of claim 20, further comprising:
determining a lowest supply voltage at which a signal can propagate through a circuit containing the standard cell multiplexer.

26. The method of claim 20, further comprising:
determining at least one of:
a voltage level that corresponds to a normal operational mode for a circuit containing the substantially identical multiplexer elements, and
a voltage level that corresponds to a power-saving mode for a circuit containing the substantially identical multiplexer elements.

27. A circuit comprising:
a plurality of standard cell multiplexers, wherein each of the plurality of standard cell multiplexers exhibits a select-to-output delay, and wherein each of the plurality of standard cell multiplexers is powered by a supply voltage that can be set to a predetermined level; and
means for generating an oscillating signal whose frequency can be used to determine the select-to-output delay, wherein the means includes no active logic elements other than the plurality of standard cell multiplexers.

28. The circuit of claim 27, wherein each of the plurality of standard cell multiplexers comprises two pass gates.

29. The circuit of claim 27, wherein each of the plurality of standard cell multiplexers is a tristate multiplexer.

30. The circuit of claim 27, wherein the means includes an even number of standard cell multiplexers.

31. An apparatus comprising:
means for forming a ring oscillator from substantially identical multiplexer elements, wherein the ring oscillator includes no active logic elements other than the substantially identical multiplexer elements, and wherein each of the substantially identical multiplexer elements is powered by a supply voltage; and
means for setting the supply voltage of each of the substantially identical multiplexer elements to a predetermined level.

* * * * *